(12) United States Patent
Hisano

(10) Patent No.: US 9,947,544 B2
(45) Date of Patent: Apr. 17, 2018

(54) METHOD OF MANUFACTURING SEMICONDUCTOR DEVICE INCLUDING FORMING PROTECTIVE FILM WITHIN RECESS IN SUBSTRATE

(71) Applicant: Mitsubishi Electric Corporation, Tokyo (JP)

(72) Inventor: Misato Hisano, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/304,558

(22) PCT Filed: Jul. 31, 2014

(86) PCT No.: PCT/JP2014/070246
§ 371 (c)(1),
(2) Date: Oct. 17, 2016

(87) PCT Pub. No.: WO2016/017007
PCT Pub. Date: Feb. 4, 2016

(65) Prior Publication Data
US 2017/0040171 A1    Feb. 9, 2017

(51) Int. Cl.
*H01L 21/265*    (2006.01)
*H01L 21/28*    (2006.01)
(Continued)

(52) U.S. Cl.
CPC ...... *H01L 21/283* (2013.01); *H01L 21/26506* (2013.01); *H01L 21/28* (2013.01);
(Continued)

(58) Field of Classification Search
None
See application file for complete search history.

(56) References Cited

U.S. PATENT DOCUMENTS

2003/0032227 A1* 2/2003 Ohara ............... H01L 21/82348
                                                            438/197
2006/0027833 A1    2/2006 Tanimoto
(Continued)

FOREIGN PATENT DOCUMENTS

JP    2006-074024 A    3/2006
JP    2011-187753 A    9/2011

OTHER PUBLICATIONS

Notification of Transmittal of Translation of the International Preliminary Report on Patentability and Translation of Written Opinion of the International Searching Authority; PCT/JP2014/070246 dated Feb. 9, 2017.

(Continued)

*Primary Examiner* — Jay C Chang
(74) *Attorney, Agent, or Firm* — Studebaker & Brackett PC

(57) ABSTRACT

An n-type layer (3) is formed by implanting an n-type impurity in a back surface of a Si substrate (1). A recess (4) is formed in the back surface of the Si substrate (1). After forming the n-type layer (3), an oxide film (5) is formed on the back surface and in the recess (4). The oxide film (5) on the back surface is removed while the oxide film (5) in the recess (4) is left. After removing the oxide film (5), an Al—Si film (6) is formed on the back surface. A metal electrode (7) is formed on the Al—Si film (6). The oxide film (5) in the recess (4) prevents Al from diffusing from the Al—Si film (6) into the Si substrate (1) through the recess (4).

7 Claims, 4 Drawing Sheets

(51) Int. Cl.
*H01L 21/283* (2006.01)
*H01L 21/324* (2006.01)
*H01L 29/45* (2006.01)
H01L 21/285 (2006.01)
H01L 21/768 (2006.01)

(52) U.S. Cl.
CPC .......... *H01L 21/324* (2013.01); *H01L 29/456* (2013.01); *H01L 21/28518* (2013.01); *H01L 21/76841* (2013.01)

(56) References Cited

U.S. PATENT DOCUMENTS

2012/0267711 A1* 10/2012 Grebs ............... H01L 29/41741
257/331
2013/0140632 A1* 6/2013 Landgraf .......... H01L 21/02107
257/335
2015/0340487 A1* 11/2015 Siemieniec ........... H01L 21/046
257/77

OTHER PUBLICATIONS

International Search Report issued in PCT/JP2014/070246; dated Oct. 21, 2014.

* cited by examiner

METHOD OF MANUFACTURING SEMICONDUCTOR DEVICE INCLUDING FORMING PROTECTIVE FILM WITHIN RECESS IN SUBSTRATE

FIELD

The present invention relates to a method of manufacturing a semiconductor device wherein a metal electrode is formed on a back surface of a Si substrate.

BACKGROUND

In a power semiconductor device for driving a large current, a metal electrode k formed on a back surface of a Si substrate (see, for example, PTL 1). An Al—Si film is formed between the Si substrate and the metal electrode for the purpose, of inhibiting separation therebetween.

CITATION LIST

Patent Literature

PTL 1: JP 2006-074024 A

SUMMARY

Technical Problem

A recess is formed in the back surface of the Si substrate due to mechanical stress at the time of wafer manufacturing. Al diffuses from the Al—Si film into the Si substrate through this recess, thereby forming a p-type layer. There is a problem that a depletion layer reaches this p-type layer to cause a leak current and a reduction in withstand voltage of the device.

The present invention has been achieved to solve the above-described problem, and an object of the present invention is to provide a method of manufacturing a semiconductor device capable of inhibiting a leak current and a reduction in withstand voltage even in a case where a recess exists in a back surface of a Si substrate.

Solution to Problem

A method of manufacturing a semiconductor device according to the present invention includes: forming an n-type layer by implanting an n-type impurity in a back surface of a Si substrate wherein a recess is formed in the back surface; after forming the n-type layer, forming a protective film on the back surface and in the recess; removing the protective film on the hack surface while the protective film in the recess is left; after removing the protective film, forming an Al—Si film on the hack surface; and forming a metal electrode on the Al—Si film, wherein the protective film in the recess prevents Al from diffusing from the Al—Si film into the Si substrate through the recess.

Advantageous Effects of Invention

In the present invention, the protective film in the recess prevents Al from diffusing from the Al—Si film into the Si substrate through the recess. Thus, although the recess exists in the back surface of the Si substrate, a teak current and a reduction in withstand voltage can be inhibited.

DESCRIPTION OF EMBODIMENTS

A method of manufacturing a semiconductor device according to the embodiments of the present invention will be described with reference to the drawings. The same components will be denoted by the same symbols, and the repeated description thereof may be omitted.

Embodiment 1

A method of manufacturing a semiconductor device according to Embodiment 1 of the present invention will be described with reference to the drawings. FIGS. 1 to 4 are sectional views showing the method of manufacturing a semiconductor device according to Embodiment 1 of the present invention.

Figure 1:
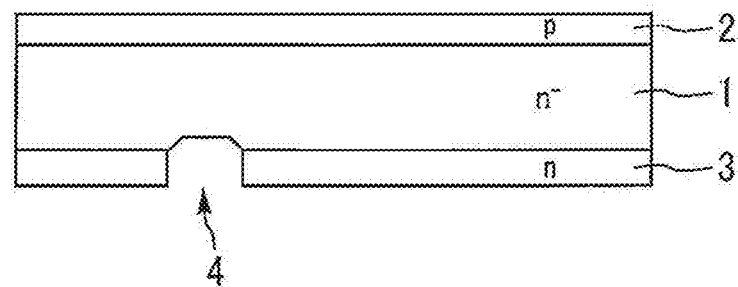
FIGS. 1 to 4 are sectional views showing the method of manufacturing a semiconductor device according to Embodiment 1 of the present invention.
Figure 2:
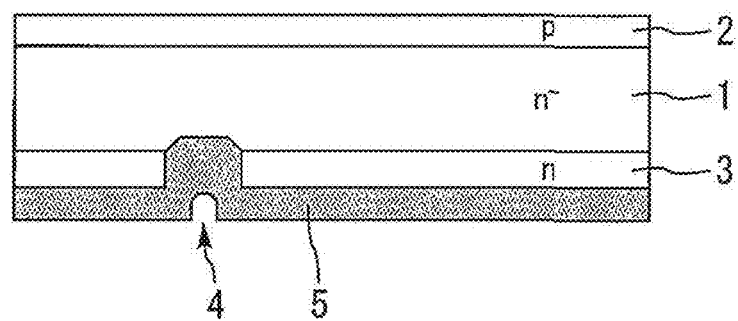
Figure 3:
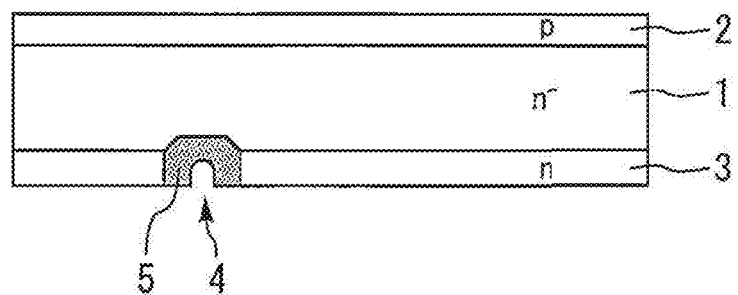
Figure 4:
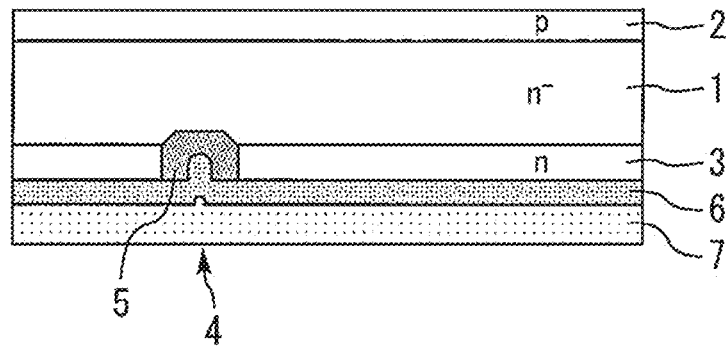

First, as shown in FIG. 1, a p-type layer 2 is formed by implanting a p-type impurity into a front surface of an n⁻-type Si substrate 1, and an n-type layer 3 is formed by implanting an n-type impurity in a back surface of the substrate 1. A recess 4 (flaw) is formed in the back surface of the Si substrate 1. Subsequently, as shown in FIG. 2, an oxide film 5 is formed on the back surface and in the recess 4. Subsequently, as shown in FIG. 3, the oxide film 5 on the back surface is removed by sputter-etching while the oxide film 5 in the recess 4 is left. It is necessary that at this time part of the oxide film 5 be left at least in an innermost portion of the recess 4. Subsequently, as shown in FIG. 4, an Al—Si film 6 is formed on the back surface. Subsequently, a metal electrode 7 is formed on the Al—Si film 6. The metal electrode 7 is a multilayer electrode.

Figure 5:
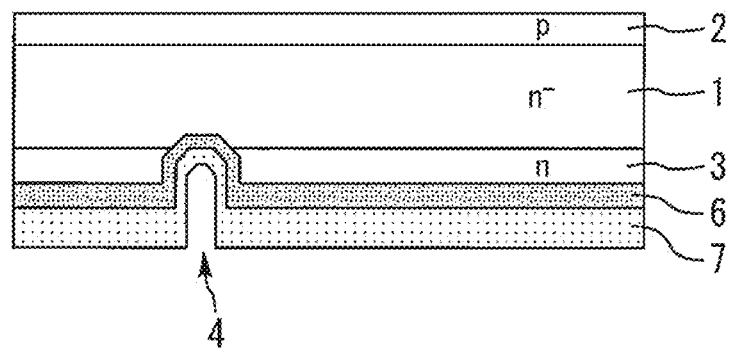
FIG. 5 is a sectional view showing a method of manufacturing a semiconductor device according to a comparative example.

The advantageous effect of the present embodiment will be described through comparison with a comparative example. FIG. 5 is a sectional view showing a method of manufacturing a semiconductor device according to a comparative example. In the comparative example, the Al—Si film 6 is in direct contact with the Si substrate 1 in an innermost portion of the recess 4. When a reverse voltage is applied to the device, therefore. Al diffuses from the Al—Si film 6 into the Si substrate 1 through the recess 4 to form a p-type layer. Because a depletion layer reaches this p-type layer, a leak current is generated and the withstand voltage of the device is reduced.

On the other hand, in the present embodiment, the oxide film 5 in the recess 4 functions as a protective film for preventing Al from diffusing from the Al—Si film 6 into the Si substrate 1 through the recess 4. Thus, although the recess 4 exists in the back surface of the Si substrate 1, a leak current and a reduction in withstand voltage can be inhibited. Also, separation between the Si substrate 1 and the metal electrode 7 can be inhibited with the Al—Si film 6.

Embodiment 2

Figure 6:
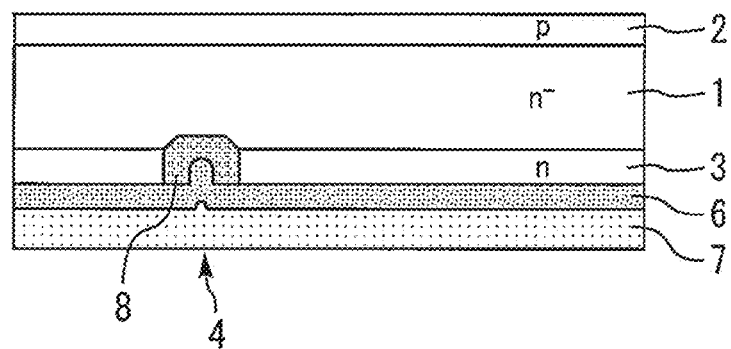
FIG. 6 is a sectional view showing a method of manufacturing a semiconductor device according to Embodiment 2 of the present invention.

FIG. 6 is a sectional view showing a method of manufacturing a semiconductor device according to Embodiment 2 of the present invention. In the present embodiment, an n-type doped polysilicon 8 is formed as a protective film in place of the oxide film 5 in Embodiment 1. In this case, the n-type doped polysilicon S in the recess 4 prevents Al from diffusing the Al—Si film 6 into the Si substrate 1 through the recess 4, thus obtaining the same advantage as in Embodiment 1. Since the n-doped polysilicon 8 is of the n-type, there is a margin for Al that activates the Si substrate 1 into the p-type and energization can be effected even through the recess 4.

Embodiment 3

Figure 7:
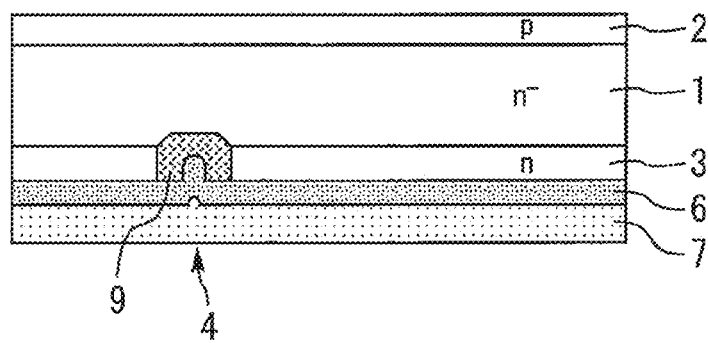
FIG. 7 is a sectional view showing a method of manufacturing a semiconductor device according to Embodiment 3 of the present invention.

FIG. 7 is a sectional view showing a method of manufacturing a semiconductor device according to Embodiment 3 of the present invention. In the present embodiment, a phosphosilicate glass 9 is formed as a protective film in place of the oxide film 5 in Embodiment 1. Also in this case, the same advantage as that in Embodiment 1 can be obtained. Since the phosphosilicate glass 9 is of the n-type, there is a margin for Al that activates the Si substrate 1 into the p-type and energization can be effected even through the recess 4.

Embodiment 4

Figure 8:
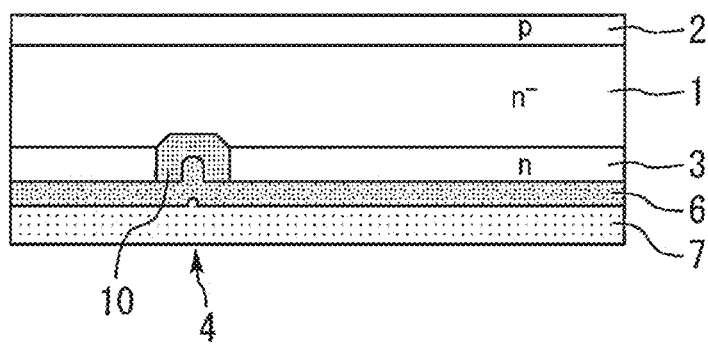
FIG. 8 is a sectional view showing a method of manufacturing a semiconductor device according to Embodiment 4 of the present invention.

FIG. 8 is a sectional view showing a method of manufacturing a semiconductor device according to Embodiment 4 of the present invention. In the present embodiment, a metal simple substance 10 (titanium) not silicidized is formed as a protective film in place of the oxide film 5 in Embodiment 1. Because the metal simple substance 10 in the recess 4 functions as a barrier metal for preventing diffusion of Al, the same advantage as that in Embodiment 1 can be obtained. The metal simple substance 10 has a good ohmic characteristic with respect to the n-type.

Embodiment 5

Figure 9:
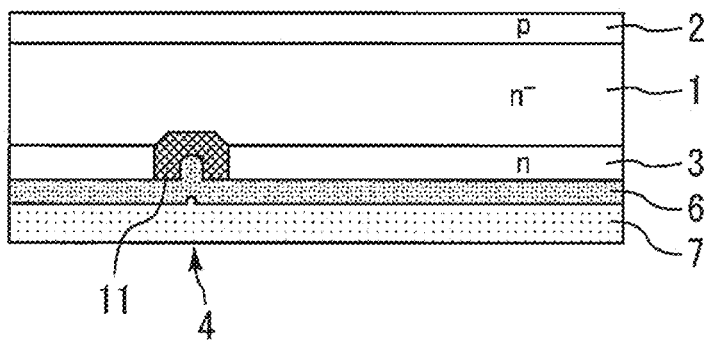
FIG. 9 is a sectional view showing a method of manufacturing a semiconductor device according to Embodiment 5 of the present invention.

FIG. 9 is a sectional view showing a method of manufacturing a semiconductor device according to Embodiment 5 of the present invention. In the present embodiment, a metal film (titanium, cobalt, tungsten or molybdenum) is formed on the back surface and in the recess 4 after the n-type layer 3 is formed. Thereafter, metal suicide 11 (titanium suicide, cobalt suicide, tungsten suicide or molybdenum suicide) is formed by performing annealing. Subsequently, the metal suicide 11 on the back surface is removed by sputter-etching while the metal silicide 11 in the recess 4 is left. Al—Si film 6 and a metal electrode 7 are thereafter formed, as are those in Embodiment 1.

The metal silicide 11 in the recess 4 functions as a protective film for preventing Al from diffusing from the Al—Si film 6 into the Si substrate 1 through the recess 4. The same advantage as that in Embodiment 1 can therefore be obtained. The metal suicide 11 is higher in ohmic characteristic with respect to the n-type layer 3 than the metal simple substance 10 and functions as a barrier metal for preventing diffusion of Al.

Embodiment 6

Figure 10:
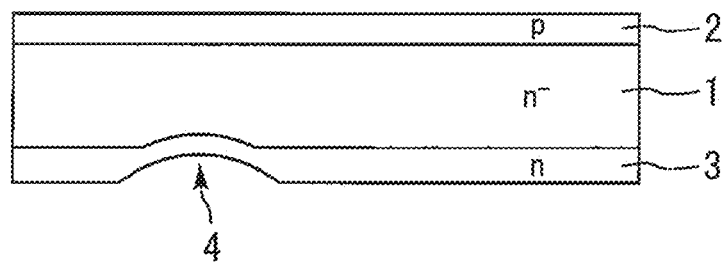
FIGS. 10 and 11 are sectional views showing a method of manufacturing a semiconductor device according to Embodiment 6 of the present invention.
Figure 11:
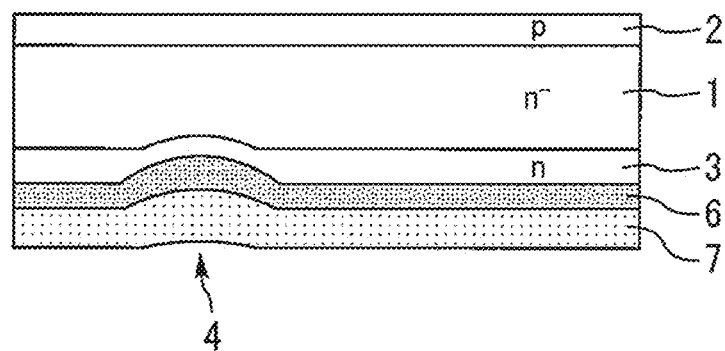

FIGS. 10 and 11 are sectional views showing a method of manufacturing a semiconductor device according to Embodiment 6 of the present invention. First, in the same way as in Embodiment 1, and as shown in FIG. 1, the p-type layer 2 is formed by implanting a p-type impurity into a front surface of the n⁻-type Si substrate 1, and the n-type layer 3 is formed by implanting an n-type impurity in the back surface of the substrate 1. The recess 4 is formed in the back surface of the Si substrate 1. Subsequently, as shown in FIG. 10, the back surface is recrystallized by laser annealing the back surface while the recess 4 is left, thereby re-forming the n-type layer 3. Subsequently, as shown in FIG. 11, the Al—Si film 6 is formed on the back surface. The metal electrode 7 is formed on the Al—Si film 6.

Prevention of diffusion of Al from the Al—Si film 6 into the Si substrate 1 through the recess 4 is thus enabled. The same advantage as that in Embodiment 1 can therefore be obtained. Also, since the n-type layer 3 can be re-formed, a change in characteristic can be inhibited. While the method of eliminating the recess 4 by melting the back surface by laser application requires a long processing time, the recess 4 is left in the present embodiment to enable shortening the laser annealing processing time and, hence, reducing the manufacturing cost.

Figure 12:
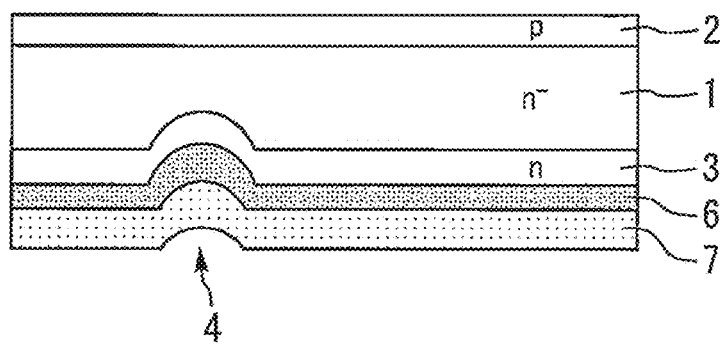
FIG. 12 is a sectional view showing a modified example of the method of manufacturing a semiconductor device according to Embodiment 6 of the present invention.

FIG. 12 is a sectional view showing a modified example of the method of manufacturing a semiconductor device according to Embodiment 6 of the present invention. Laser annealing is selectively performed only on the recess 4. Recrystallization of a portion including and around the recess 4 can be performed in this way and the advantage of Embodiment 6 can therefore be obtained. Since laser annealing is selectively performed, the laser annealing processing time can be further reduced and a reduction in manufacturing cost can therefore be achieved.

REFERENCE SIGNS LIST

1 Si substrate; 3 n-type layer; 4 recess; 5 oxide film; 6 Al—Si film; 7 metal electrode; 8 n-type doped polysilicon; 9 phosphosilicate glass; 10 metal simple substance; 11 metal suicide

The invention claimed is:
1. A method of manufacturing a semiconductor device comprising:
 forming an n-type layer by implanting an n-type impurity in a back surface of a Si substrate wherein a recess is formed in the back surface;
 after forming the n-type layer, forming a protective film directly on the back surface and in the recess;
 removing the protective film on the back surface while the protective film in the recess is left;
 after removing the protective film, forming an Al—Si film directly on both the back surface and a surface of the protective film, wherein the surface of the protective film directly on the Al—Si film is directly under the recess; and forming a metal electrode on the Al—Si film,
wherein the protective film in the recess prevents Al from diffusing from the Al—Si film into the Si substrate through the recess.

2. The method of manufacturing a semiconductor device according to claim 1, wherein the protective film is an oxide film.

3. The method of manufacturing a semiconductor device according to claim 1, wherein the protective film is an n-type doped polysilicon or a phosphosilicate glass.

4. The method of manufacturing a semiconductor device according to claim 1, wherein the protective film is a metal simple substance.

5. The method of manufacturing a semiconductor device according to claim 1, wherein the protective film is metal silicide.

6. The method of manufacturing a semiconductor device according to claim 1, wherein the recess is a flaw.

7. The method of manufacturing a semiconductor device according to claim 1, wherein a p-type layer is formed by implanting a p-type impurity into a front surface of the Si substrate.

* * * * *